United States Patent
Naidu et al.

(10) Patent No.: US 11,169,195 B2
(45) Date of Patent: Nov. 9, 2021

(54) IDENTIFICATION OF FAULTY SECTION OF POWER TRANSMISSION LINE

(71) Applicant: ABB Power Grids Switzerland AG, Baden (CH)

(72) Inventors: Obbalareddi Demudu Naidu, Bangalore (IN); Neethu George, Bangalore (IN)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 311 days.

(21) Appl. No.: 16/524,134

(22) Filed: Jul. 28, 2019

(65) Prior Publication Data
US 2020/0041562 A1 Feb. 6, 2020

(30) Foreign Application Priority Data

Jul. 31, 2018 (IN) .............................. 201841028697
Sep. 19, 2018 (EP) ..................................... 18195509

(51) Int. Cl.
*G01R 31/08* (2020.01)
*H02H 7/26* (2006.01)
*H02H 1/00* (2006.01)

(52) U.S. Cl.
CPC ......... *G01R 31/088* (2013.01); *G01R 31/083* (2013.01); *G01R 31/085* (2013.01); *H02H 1/0007* (2013.01); *H02H 7/26* (2013.01)

(58) Field of Classification Search
CPC .. G01R 31/088; G01R 31/085; G01R 31/083; G01R 31/08; H02H 7/26; H02H 1/0007; H02H 7/263; H02H 3/042; Y04S 10/52

(Continued)

(56) References Cited

U.S. PATENT DOCUMENTS 8,943,954 B2 * 2/2015 Conti .................. A47J 43/0711
99/537
8,942,954 B2 11/2015 Gong et al.
(Continued)

FOREIGN PATENT DOCUMENTS

CN 105699858 A 6/2016
CN 108008251 A 5/2018

OTHER PUBLICATIONS

European Search Report for EP 18195509.7-1202, dated Mar. 20, 2019, 8 pages.

*Primary Examiner* — Dharti H Patel
(74) *Attorney, Agent, or Firm* — Slater Matsil, LLP

(57) ABSTRACT

Techniques for identifying faulty sections in power transmission lines are described. A first positive sequence voltage and first positive sequence current at a first terminal of a power transmission line are computed based on a first voltage and first current at the first terminal. A second positive sequence voltage and second positive sequence current at a second terminal are computed based on a second voltage and second current. Based on the first positive sequence voltage and the first positive sequence current, a first junction voltage and first junction current from the first terminal at a junction are computed. Based on the second positive sequence voltage and the second positive sequence current, a second junction voltage and second junction current from the second terminal are computed. A ratio of a junction voltage parameter to a junction current parameter is computed. Using the ratio, the faulty section is identified.

11 Claims, 4 Drawing Sheets

(58) Field of Classification Search
USPC .......................................................... 702/59
See application file for complete search history.

(56) References Cited

U.S. PATENT DOCUMENTS

| | | | | |
|---|---|---|---|---|
| 10,197,614 | B2* | 2/2019 | Benmouyal | G01R 31/085 |
| 2003/0085715 | A1* | 5/2003 | Lubkeman | G01R 31/086 |
| | | | | 324/509 |
| 2011/0037480 | A1 | 2/2011 | Balcerek et al. | |
| 2014/0229127 | A1* | 8/2014 | Ren | G01R 31/088 |
| | | | | 702/59 |
| 2018/0316183 | A1* | 11/2018 | Naidu | H02H 1/0007 |
| 2020/0209299 | A1* | 7/2020 | Sri Gopala Krishna Murthi | ........ |
| | | | | H04L 12/40 |
| 2021/0143633 | A1* | 5/2021 | Naidu | H02H 7/263 |

* cited by examiner

IDENTIFICATION OF FAULTY SECTION OF POWER TRANSMISSION LINE

CROSS-REFERENCE TO RELATED APPLICATIONS

This application claims priority to European Patent Application No. 18195509.7, filed Sep. 19, 2018, and to Indian Patent Application No. 201841028697, filed Jul. 31, 2018, the entire disclosures of which are incorporated herein by reference.

TECHNICAL FIELD

The present subject matter relates, in general, to power transmission lines and, in particular, to identification of a section of a power transmission line having a fault.

BACKGROUND

Power transmission lines can be used for transmitting electric power from generating stations that generate electric power to consumers of the electric power. A power transmission line may include a plurality of sections, such as an overhead line (OHL) section and an underground cable (UGC) section. Sometimes, a section of the power transmission line may have a fault, such as a phase-to-ground fault or a phase-to-phase fault.

BRIEF DESCRIPTION OF DRAWINGS

The features, aspects, and advantages of the present subject matter will be better understood with regard to the following description, and accompanying figures. The use of the same reference number in different figures indicates similar or identical features and components.

DETAILED DESCRIPTION

Figure 1:
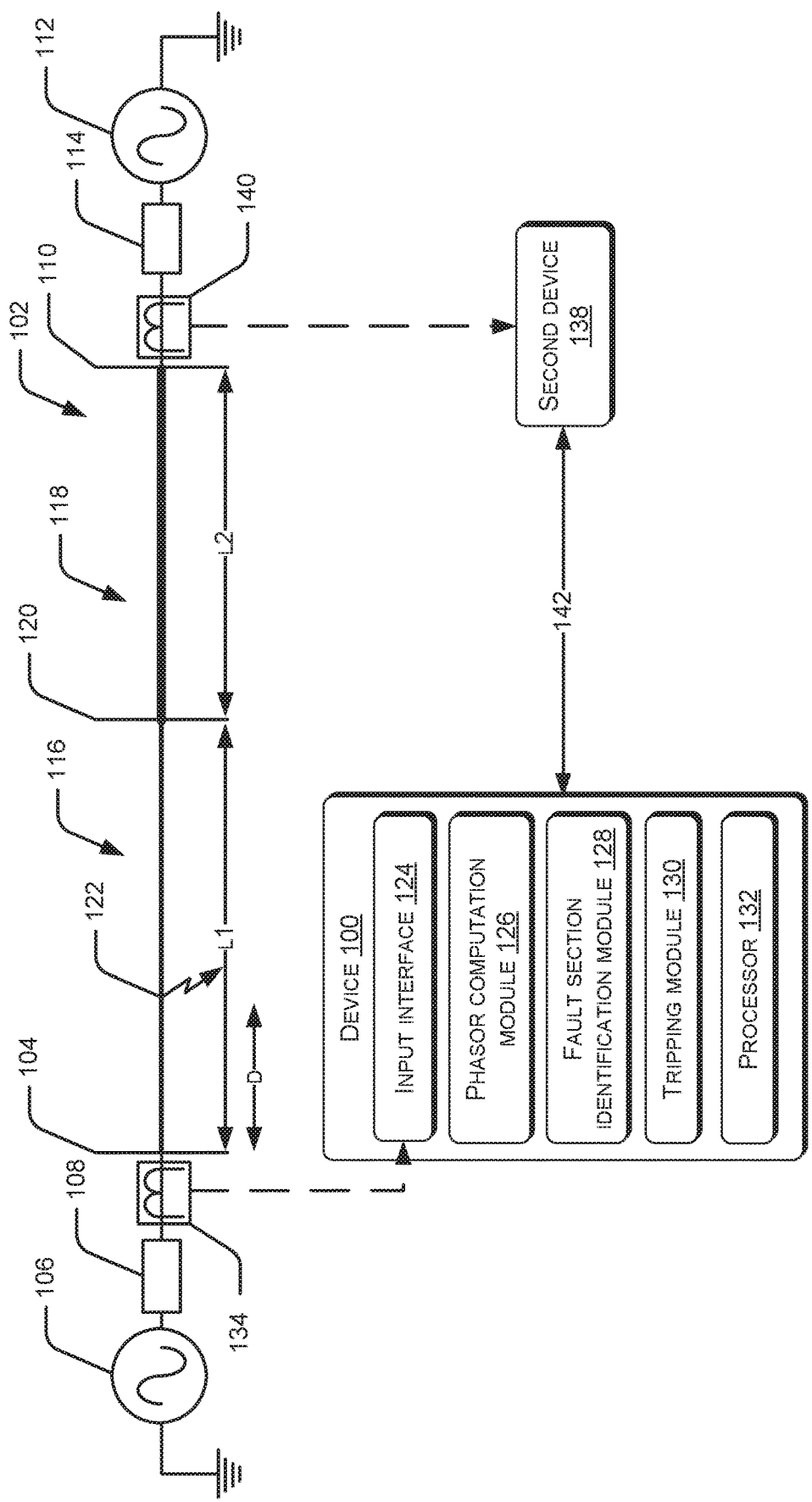
FIG. 1 illustrates a device for identifying a section of a power transmission line having a fault, in accordance with an implementation of the present subject matter.

The present subject matter relates to systems and methods for identification of a section of a power transmission line that has a fault.

A power transmission line may include more than one section. For example, the power transmission line may include an overhead line (OHL) section and an underground cable (UGC) section joined together at a junction. A power transmission line having both an OHL section and a UGC section may be referred to as a mixed power transmission line.

Sometimes, electrical faults, commonly referred to as faults, may occur on the power transmission lines. In case of a mixed power transmission line, the fault may occur in any section, such as in the OHL section or UGC section. In such cases, a section on which the fault has occurred may have to be determined. One reason for performing the determination is to decide whether auto-reclosing of a circuit breaker on the power transmission line is to be performed or not. For instance, since, generally, faults on the OHL section are transient in nature, auto-reclosing can be performed for a fault in the OHL section for a fast restoration of power supply. Contrarily, since faults in the UGC section are generally non-transient in nature, auto-reclosing may not be performed for a fault on the UGC section to prevent damage to the UGC.

However, the correct identification of the section having the fault may not be possible, for example, due to different surge impedances of the OHL section and the UGC section.

The present subject matter relates to systems and methods for identification of a section of a power transmission line that has a fault. The systems and methods of the present subject matter can be used for accurately identifying a section of a mixed power transmission line that is having a fault.

In an implementation of the present subject matter, a first positive sequence voltage and a first positive sequence current at a first terminal of a power transmission line are computed based on a first voltage and a first current, respectively, at the first terminal. In addition to the first terminal, the power transmission line also includes a second terminal, a first section and second section between the first terminal and second terminal, and a junction between the first terminal and the second terminal. The first section may be an overhead line (OHL) section and a second line may be an underground cable (UGC) section.

Further, a second positive sequence voltage and a second positive sequence current at the second terminal may be computed based on a second voltage and a second current, respectively, at the second terminal. Based on the first positive sequence voltage and first positive sequence current, a first junction voltage and a first junction current at the junction from the first terminal are computed. Further, a second junction voltage and a second junction current at the junction from the second terminal are also computed.

Subsequently, a ratio of a junction voltage parameter to a junction current parameter is computed. The junction voltage parameter depends on the first junction voltage and the second junction voltage. Similarly, the junction current parameter depends on the first junction current and the second junction current. Based on the ratio, the section having the fault may then be identified.

With the systems and methods of the present subject matter, a section of a power transmission line that has a fault can be accurately identified. Consequently, an informed decision as to whether auto-reclosing is to be enabled or not can be taken. Further, to implement the techniques of the present subject matter, a device performing the techniques may utilize even a low sampling frequency, such as less than 4 KHz, for sampling voltage and current signals.

The above and other features, aspects, and advantages of the subject matter will be better explained with regard to the following description, appended claims, and accompanying figures.

FIG. 1 illustrates a device 100 for identifying a section of a power transmission line 102 having a fault, in accordance with an implementation of the present subject matter. The section that has a fault may be interchangeably referred to as a faulty section. The device 100 may be implemented as any computing device which may be, but is not restricted to, a server, a workstation, a desktop computer, a laptop, and an application. In an example, the device 100 may be an Intelligent Electronic Device (IED), which is a device used to control power system equipment, such as a circuit breaker, disconnector, transformer, and the like.

The power transmission line 102 may be used to transmit electric power. The electric power transmitted may be at high voltages, such as in the range of kilovolts, and for long distances, such as for tens or hundreds of kilometres. The power transmission line 102 includes a first terminal 104 at which the power transmission line 102 receives electric power from a first electric generator 106. The first terminal 104 may also be referred to as a first bus 104. An internal impedance of the first electrical generator 106 is represented by a first impedance 108. The power transmission line 102 also includes a second terminal 110 at which the power transmission line 102 receives electric power from a second electrical generator 112. The second terminal 110 may also be referred to as a second bus 110. An internal impedance of the second electrical generator 112 is represented as a second impedance 114.

Between the first terminal 104 and the second terminal 110, the power transmission line 102 may include a plurality of sections and a junction between two of the plurality of sections. For example, the power transmission line 102 includes a first section 116 that is an overhead line (OHL) section and a second section 118 that is an underground cable (UGC) section. Since the power transmission line 102 includes both an OHL section and UGC section, the power transmission line 102 may be referred to as a mixed power transmission line. The first section 116 and the second section 118 may be joined at a junction 120.

Sometimes, an electrical fault, commonly referred to as a fault, may occur on the power transmission line 102. For example, as illustrated in FIG. 1, the fault may occur at a location 122 of the power transmission line 102. The fault may be, for example, a phase-to-ground fault or a phase-to-phase fault. Since the power transmission line 102 is a mixed power transmission line, the identification of a faulty section, i.e., whether the fault is present in the first section 116 or the second section 118, may not be a straightforward task. This may be because of different surge impedances of the first section 116 and the second section 118.

To facilitate identification of the section having the fault, the device 100 may utilize various components, such as an input interface 124, a phasor computation module 126, and a fault section identification module 128. In addition, the device 100 may also include a tripping module 130. Each of the phasor computation module 126, fault section identification module 128, and tripping module 130 may be coupled to a processor 132. Further, the phasor computation module 126, fault section identification module 128, and tripping module 130 may be implemented in hardware, instructions executed by the processor 132, or by a combination thereof.

In operation, the input interface 124 may obtain measurements of a first voltage at the first terminal 104 and a first current at the first terminal 104. For this, the input interface 124 may include input modules that can receive and process the measurements of the voltage and current in the form of analog signals. Such input modules may be connected to instrument transformers 134, which, in turn, are connected to the first terminal 104 of the power transmission line 102. The instrument transformers 134 may include a voltage transformer and a current transformer, which measure the first voltage and the first current, respectively.

The input interface 124 may also obtain measurements of a second voltage and a second current at the second terminal 110. For this, in an example, the input interface 124 may receive the measurements of the second voltage and the second current from a second device 138. The second device 138 may be, for example, an IED, and may be interchangeably referred to as the second IED 138. The second device 138 may be connected at the second terminal 110 through instrument transformers 140. The measurements of the second voltage and the second current may be received from the second device 138 in the form of analog signals through a communication link 142 between the device 100 and the second device 138. The communication link 142 may be, for example, a fibre optic link.

Based on the first voltage and first current, the phasor computation module 126 may compute, respectively, a positive sequence voltage phasor and a positive sequence current phasor. For instance, based on the first voltage, the positive sequence voltage phasor may be computed, and based on the first current, the positive sequence current phasor may be computed. The positive sequence voltage phasor and positive sequence current phasor are positive sequence voltage at the first terminal 104 and positive sequence current flowing from the first terminal 104, respectively, subsequent to the fault. The positive sequence voltage phasor may be referred to as the first positive sequence voltage phasor or first positive sequence voltage. Further, the positive sequence current phasor may be referred to as the first positive sequence current phasor or first positive sequence current. The first positive sequence voltage and the first positive sequence current may be represented as $V_1$ and $I_1$, respectively. To compute the first positive sequence voltage and first positive sequence current, the phasor computation module 126 may utilize any suitable phasor estimation technique.

The phasor computation module 126 may also compute positive sequence voltage phasor at the second terminal 110 and positive sequence current phasor flowing from the second terminal 110 subsequent to the fault, based on the second voltage and second current, respectively. For instance, based on the second voltage, the positive sequence voltage phasor at the second terminal 110 may be computed, and based on the second current, positive sequence current phasor at the second terminal may be computed. The positive sequence voltage phasor at the second terminal 110 may be referred to as second positive sequence voltage phasor or second positive sequence voltage. Further, the positive sequence current phasor flowing from the second terminal 110 may be referred to as second positive sequence current phasor or second positive sequence current. The second positive sequence voltage and second positive sequence current may be represented as $V_2$ and $I_2$, respectively.

In an implementation, instead of computing the second positive sequence voltage and the second positive sequence current, the device 100 may receive the second positive sequence voltage and the second positive sequence current from the second device 138. For this, the second device 138 may compute the second positive sequence voltage and the second positive sequence current based on the second voltage and the second current. Subsequently, the second device 138 may send, instead of the second voltage and second current, the second positive sequence voltage and the second positive sequence current to the device 100.

Based on the first positive sequence voltage and first positive sequence current, a voltage and a current at the junction 120 from the first terminal 104 are computed. The voltage and the current at the junction 120 from the first terminal 104 are referred to as the first junction voltage and the first junction current, respectively, and may be represented as $V_{J1}$ and $I_{J1}$, respectively. Similarly, a second junction voltage and a second junction current at the junction 120 from the second terminal 110 are computed based on the second positive sequence voltage and second positive sequence current. The second junction voltage and the second junction current may be represented as $V_{J2}$ and $I_{J2}$, respectively. The computation of $V_{J1}$, $I_{J1}$, $V_{J2}$, and $I_{J2}$, is explained below:

As is well known, a power transmission line can be mathematically modelled using its line impedance parameters commonly referred to as ABCD parameters. The parameters A, B, C, and D can be computed using the below equations:

$$V_S = AV_R + BI_R \quad (1), \text{ and}$$

$$I_S = CV_R + DI_R \quad (2)$$

where $V_S$ and $V_R$ are positive sequence line-to-neutral voltages at a sending end and a receiving end, respectively, of the power transmission line, and $I_S$ and $I_R$ are a positive sequence line current entering at the sending end and a positive sequence line current leaving at the receiving end, respectively.

Therefore, for the first section 116 of the power transmission line 102, equations (1) and (2) may be written as follows:

$$\begin{bmatrix} V_1 \\ I_1 \end{bmatrix} = \begin{bmatrix} A_1 & B_1 \\ C_1 & D_1 \end{bmatrix} \begin{bmatrix} V_{J1} \\ I_{J1} \end{bmatrix} \quad (3)$$

where $A_1$, $B_1$, $C_1$, and $D_1$ are the ABCD parameters of the first section 116.

It is also known that the values of the ABCD parameters may be computed as per the below equations:

$$A_1 = D_1 = \cosh(\gamma 1 l1) \quad (4)$$

$$B_1 = Z_{C1} \sinh(\gamma 1 l1) \quad (5)$$

$$C_1 = \frac{1}{Z_C 1} \sinh(\gamma 1 l1) \quad (6)$$

where $\gamma 1$ is a propagation constant of the first section 116, l1 is a length of the first section 116, and $Z_{C1}$ is a characteristic impedance of the first section 116. $\gamma 1$ and $Z_{C1}$ may be computed using the below equations:

$$Z_{c1} = \sqrt{(r1 + j\omega L1)/(j\omega c1)} \quad (7)$$

$$\gamma_1 = \sqrt{(r1 + j\omega L1)(j\omega c1)} \quad (8)$$

where r1, L1, and c1 are resistance, inductance, and capacitance, respectively, per unit length of the first section 116.

Substituting the values of A1, B1, C1, and D1 from equations (4)-(6) in (3), $V_{J1}$ and $V_{J2}$ may be obtained as follows:

$$V_{J1} = V_1 \cosh(\gamma 1 l1) - I_1 Z_{c1} \sinh(\gamma 1 l1), \text{ and} \quad (9)$$

$$I_{J1} = I_1 \cosh(\gamma 1 l1) - V_1 \frac{1}{Z_{c1}} \sinh(\gamma 1 l1) \quad (10)$$

Equations (9) and (10) provide the first junction voltage and the first junction current as a function of the first positive sequence voltage and first positive sequence current. Since the first positive sequence voltage and first positive sequence current are already computed, and the characteristic impedance, the propagation constant, and the length of the first section 116 are known constants, the first junction voltage and the first junction current may be computed using equations (9) and (10), respectively.

Similar to equations (9) and (10), the second junction voltage and second junction current may be written as a function of the second positive sequence voltage and second positive sequence current as below:

$$V_{J2} = V_2 \cosh(\gamma 2 l2) - I_2 Z_{c2} \sinh(\gamma 2 l2), \text{ and} \quad (11)$$

$$I_{J2} = I_2 \cosh(\gamma 2 l2) - V_2 \frac{1}{Z_{c2}} \sinh(\gamma 2 l2) \quad (12)$$

where $\gamma 2$ is a propagation constant of the second section 118, l2 is a length of the second section 118, and $Z_{C2}$ is a characteristic impedance of the second section 118.

Using equations (11) and (12), the second junction voltage and second junction current may then be computed.

Upon computing the first junction voltage and second junction voltage, a junction voltage parameter is computed based on the first junction voltage and second junction voltage. In an example, the junction voltage parameter is a difference between the first junction voltage and second junction voltage, as represented below:

$$JVP1 = V_{J1} - V_{J2} \quad (13),$$

where JVP1 is the junction voltage parameter.

Further, using the first junction current and second junction current, a junction current parameter may be computed. In an example, the junction current parameter is a sum of the first junction current and second junction current, as represented below:

$$JCP1 = I_{J1} + I_{J2} \quad (14),$$

where JCP1 is the junction current parameter.

Thereafter, a ratio of the junction voltage parameter to the junction current parameter is computed, as represented below:

$$R1 = JVP1/JCP1 = (V_{J1} - V_{J2})/(I_{J1} + I_{J2}) \quad (15)$$

where R1 is the ratio.

The ratio may be used to identify the section having the fault. In other words, the ratio may be used to determine whether the fault is in the first section 116 or the second section 118. This will be explained below:

Similar to the first junction voltage and the first junction current, the voltage and current at a location of the fault, i.e., at the location 122, from the first terminal 104 may be written as a function of the first positive sequence voltage and first positive sequence current as follows:

$$V_{F1} = V_1 \cosh(\gamma 1 d) - I_1 Z_{c1} \sinh(\gamma 1 d) \quad (16)$$

$$I_{F1} = I_1 \cosh(\gamma 1 d) - V_1 \frac{1}{c1} \sinh(\gamma 1 d) \quad (17)$$

where $V_{F1}$ is the voltage at the location 122 from the first terminal 104, $I_{F1}$ is the current at the location 122 from the first terminal 104, and d is the distance of the fault from the first terminal 104. $V_{F1}$ and $I_{F1}$ may also be referred to as first fault voltage and first fault current, respectively.

Further, the first junction voltage and the first junction current may be represented in terms of the first fault voltage and first fault current as below:

$$V_{J1} = V_{F1}\cosh(\gamma 1(d-l1)) - I_{F1}Z_{c1}\sinh(\gamma 1(d-l1)), \text{ and} \quad (18)$$

$$I_{J1} = I_{F1}\cosh(\gamma 1(d-l1)) - V_{F1}\frac{1}{Z_{c1}}\sinh(\gamma 1(d-l1)) \quad (19)$$

Expanding the sin and cos hyperbolic functions in equations (18) and (19) and rearranging, the first junction voltage and the first junction current may be represented as below:

$$V_{J1} = (V_1\cosh(\gamma 1 l1) - I_1 Z_{c1}\sinh(\gamma 1 l1)) + I_{F1}Z_{c1}\sinh(\gamma 1(d-l1)), \quad (20)$$

$$I_{J1} = (I_1\cosh(\gamma 1 l1) - V_1\frac{1}{Z_{c1}}\sinh(\gamma 1 l1) - I_{F1}\sinh(\gamma 1(d-l1)) \quad (21)$$

Using equations (11), (12), (20), and (21), the below equations may be obtained:

$$V_{J1} - V_{J2} = I_{F1}Z_{c1}\sin h(\gamma 1(d-l1)) \quad (22)$$

$$I_{J1} + I_{J2} = I_{F1}\cos h(\gamma 1(d-l1)) \quad (23)$$

As will be understood, the equation (22) represents the junction voltage parameter and the equation (23) represents the junction current parameter. Thus, the ratio may be written as below:

$$R1 = Z_{c1}\tan h(\gamma 1(d-l1)) \quad (24)$$

Since $\gamma 1$ is a complex number, tan h($\gamma 1$(d–l1)) is also a complex number, and may be written as tan h (A+jB), where A and B are constants. Further, since tan h (A+jB) is another complex number, say C+jD, that depends on (A+jB), it may be concluded that R1 is proportional to ($\gamma 1$(d–l1)). Therefore, the ratio may be written as below:

$$R1 = k(\gamma 1(d-l1)) \quad (25),$$

where k is a proportional constant.

Equation (25) may be re-written as below:

$$R1 = k(\alpha 1 + j\beta 1)(d-l1) \quad (26)$$

where $\alpha 1$ is the real part of the propagation constant $\gamma 1$, and may be referred to as an attenuation constant of the first section 116. Further, $\beta 1$ is the imaginary part or angle of the propagation constant $\gamma 1$, and may be referred to as a phase constant of the first section 116.

From equation (26), it can be seen that the ratio is a complex number. Further, since the values of k, $\alpha 1$, and $\beta 1$ are positive, it can be understood that a sign (whether positive or negative) of the ratio depends on the value of (d–l1). In other words, if (d–l1) is greater than zero, both of a real part of the ratio and an imaginary part of the ratio are greater than zero. If, on the other hand, (d–l1) is lesser than zero, both of the real part of the ratio and the imaginary part of the ratio are lesser than zero.

As will be understood, (d–l1) will be lesser than zero if the location 122 of the fault is in the first section 116, i.e., between the first terminal 104 and the junction 120 (as d<l1), as illustrated in FIG. 1. Contrarily, (d–l1) will be greater than zero if the location 122 of the fault is in the second section 118. Therefore, to determine whether the fault is in the first section 116 or the second section 118, the ratio may be computed using the equations (7)-(15). Subsequently, it may be checked whether the real part of the ratio or the imaginary part of the ratio is greater or lesser than zero. If the real part or the imaginary part is lesser than zero, it may be determined that the fault has occurred in the first section 116. If, on the other hand, the real part or the imaginary part is greater than zero, it may be determined that the fault has occurred in the second section 118.

In an example, for identifying the faulty section, the imaginary part alone may be used, as generally, the value of the imaginary part is very high, and can be used to accurately identify the section having the fault, even if the location 122 is close to the junction 120 (when d is almost equal to l1).

Thus, using the ratio, the section of the power transmission line 102 that has a fault can be identified. In an implementation, the computations of the first junction voltage, first junction current, second junction voltage and a second junction current, and the ratio and the identification of the faulty section may be performed by the fault section identification module 128.

Upon identifying the section having the fault, the tripping module 130 may determine whether auto-reclosing is to be enabled or blocked based on the section that is identified as having the fault. As will be known, auto-reclosing may be enabled to close a circuit breaker (not shown in FIG. 1) that tripped, after a predetermined period has elapsed subsequent to the tripping. Since most number of faults occurring on the first section 116, which is an OHL section, are likely to be transient in nature, if the fault section identification module 128 determines the fault to be present in the first section 116, the tripping module 130 may enable the auto-reclosing. Subsequently, the tripping module 130 may send an auto-reclosing command to the circuit breaker. This ensures fast restoration of power supply that got interrupted due to the tripping of the circuit breaker. On the other hand, since the faults occurring on the second section 118, which is a UGC section, are non-transient in nature, enabling auto-reclosing may damage the cables of the second section 118, as the fault may be still present on the second section 118. Therefore, when the fault is determined to be in the second section 118, the tripping module 130 blocks the auto-reclosing function.

Figure 2:
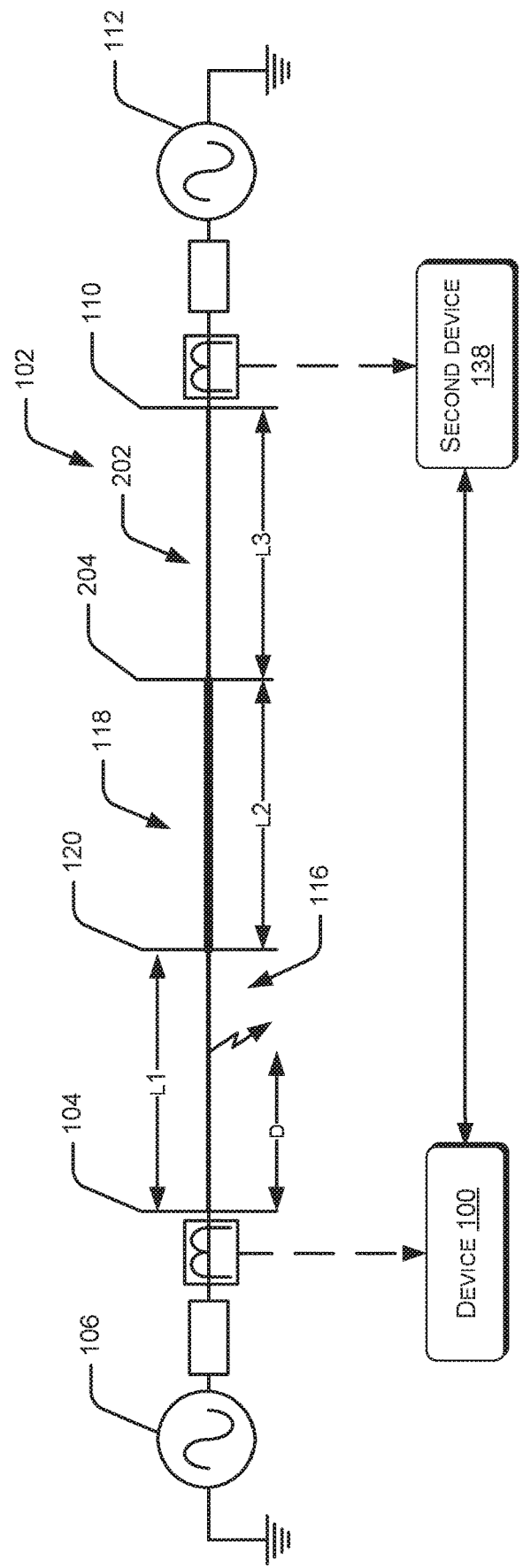
FIG. 2 illustrates a device for identification of a section having a fault in a power transmission line when the power transmission line has three sections, in accordance with an implementation of the present subject matter.

Although the power transmission line is explained as having the first section as the OHL section and the second section as the UGC section, the techniques of the present subject matter can be used in cases where the first section is the UGC section and the second section is the OHL section. Further, although the determination of the section having the fault is explained with reference to a mixed power transmission line having two sections (one OHL section and one UGC section), the determination may be performed even for a mixed power transmission line having more than two sections, such as three sections, as will be explained below:

FIG. 2 illustrates the device 100 for identification of the section having the fault in the power transmission line 102 when the power transmission line 102 has three sections, in accordance with an implementation of the present subject matter. As illustrated, in addition to the first section 116 and the second section 118, the power transmission line 102 includes a third section 202. The third section 202 may be connected to the second terminal 110 and may be between the second terminal 110 and the second section 118. Accordingly, a second junction 204 may be present between the second section 118 and the third section 202. Further, the third section 202 may be an OHL section.

In the above case, the fault section identification module 128 may compute a third junction voltage and third junction current at the second junction 204 from the first terminal 104. Further, the fault section identification module 128 may also compute a fourth junction voltage and a fourth junction current at the second junction 204 from the second terminal 110.

The third junction voltage and the third junction current may be computed based on the ABCD parameters of the first section 116 and the ABCD parameters of the second section 118 in the manner as explained with reference to equations (1)-(10). Similarly, the fourth junction voltage and the fourth junction current may be computed based on the ABCD parameters of the third section 202. The third junction voltage, third junction current, fourth junction voltage, and fourth junction current may be represented as $V_{J3}$, $I_{J3}$, $V_{J4}$, and $I_{J4}$ respectively.

As will be understood, when the third section 202 is between the second terminal 110 and the second section 118 as illustrated, the second junction voltage and second junction current, which are the voltage and current at the junction 120 from the second terminal 110, will depend on the ABCD parameters of both the second section 118 and third section 202.

Based on the third junction voltage and fourth junction voltage, a second junction voltage parameter may be computed. For example, the second junction voltage parameter may be a difference between the third junction voltage and fourth junction voltage, as represented below:

$$JVP2 = V_{J3} - V_{J4} \qquad (27),$$

where JVP2 is the second junction voltage parameter.

Further, based on the third junction current and fourth junction current, a second junction current parameter may be computed. In an example, the second junction current parameter is a sum of the third junction current and fourth junction current, as represented below:

$$JCP2 = I_{J3} + I_{J4} \qquad (28),$$

where JCP2 is the second junction current parameter.

Subsequently, a second ratio of the second junction voltage parameter to the second junction current parameter may be computed, as represented below:

$$R2 = JVP2/JCP2 = (V_{J3} - V_{J4})/(I_{J3} + I_{J4}) \qquad (29)$$

where R2 is the second ratio.

Similar to the equation (26), the second ratio may be represented in terms of the distance of the location 122 of the fault from the first terminal 104 as below:

$$R2 = k(\alpha 1 + j\beta 1)(d - (l1 + l2)) \qquad (30)$$

Based on the values of the ratio and the second ratio, the section having the fault may then be identified. For instance, as explained earlier, if the real or imaginary part of the ratio is less than zero, it may be determined that the fault is present in the first section 116. If the real or imaginary part of the ratio is greater than zero, the fault may be present either in the second section 118 or the third section 202, as, in both situations, the distance of the location 122 of the fault from the first terminal 104 (d) is greater than the length of the first section (l1). Therefore, the value of the real or imaginary part of the second ratio is checked.

If the value of the real or imaginary part of the second ratio is lesser than zero, the fault may be determined to be present between the junction 120 and the second junction 204, i.e., in the second section 118. This is because, in this case, the distance of the location 122 of the fault (d) is lesser than the distance of the second junction 204 from the first terminal 104 (l1+l2). Thus, (d−(l1+l2)) is lesser than zero, and, as per equation (30), the second ratio is lesser than zero.

If the value of the real or imaginary part of the second ratio is greater than zero, the fault may be determined to be present between the second junction 204 and the second terminal 110, i.e., in the third section 202. This is because, in this case, the distance of the location 122 of the fault (d) is greater than the distance of the second junction 204 from the first terminal 104 (l1+l2).

Although FIG. 2 has been explained with respect to a scenario in which the third section 202 is between second section 118 and the second terminal 110, it will be understood that the present subject matter can be utilized even in cases in which the third section 202 is between the first terminal 104 and the first section 116. Accordingly, the second junction 204 may be present between the third section 202 and the first section 116.

Figure 3:
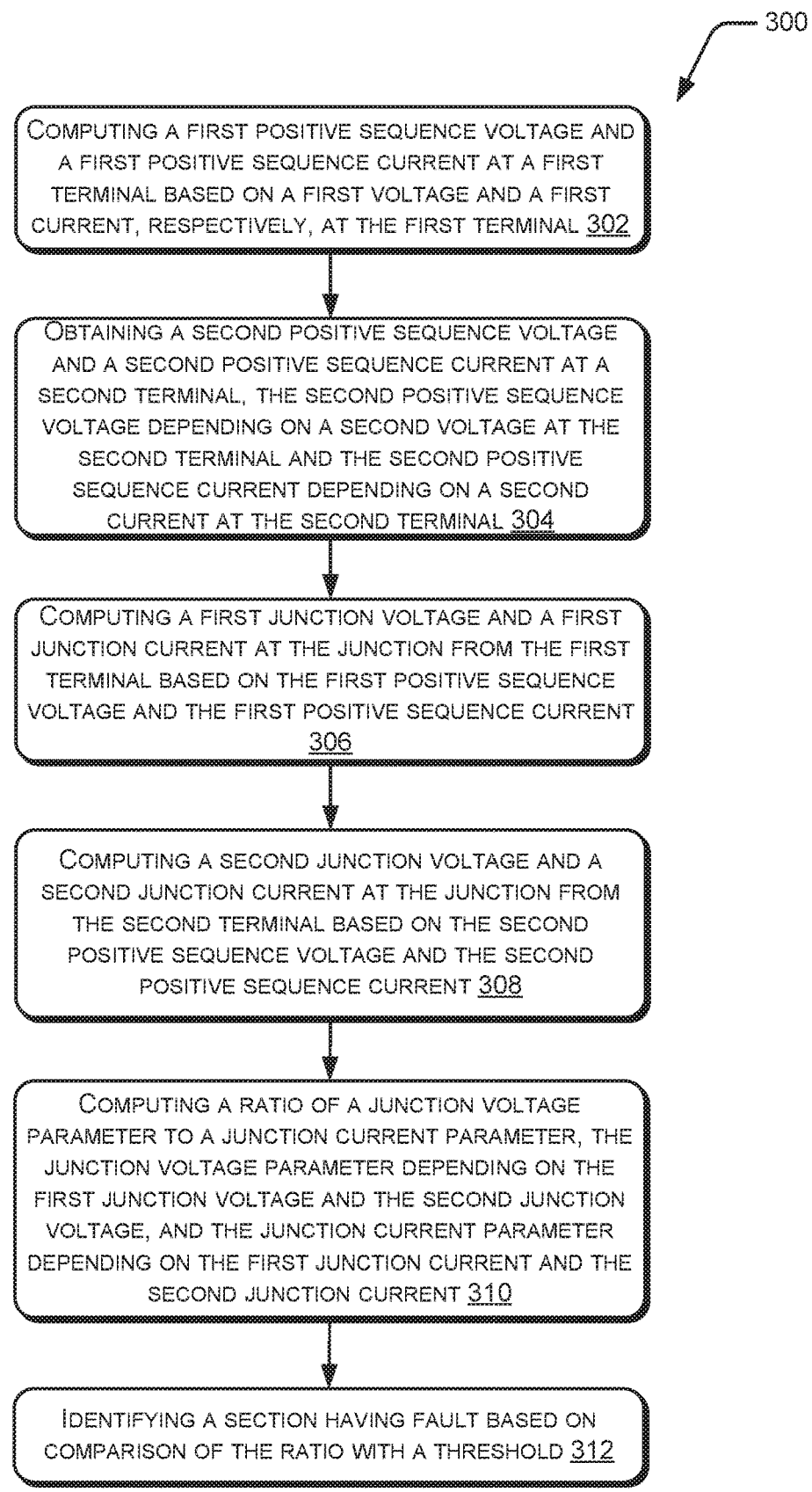
FIG. 3 illustrates a method for identification of a section of a power transmission line having a fault, in accordance with an implementation of the present subject matter.
Figure 4:
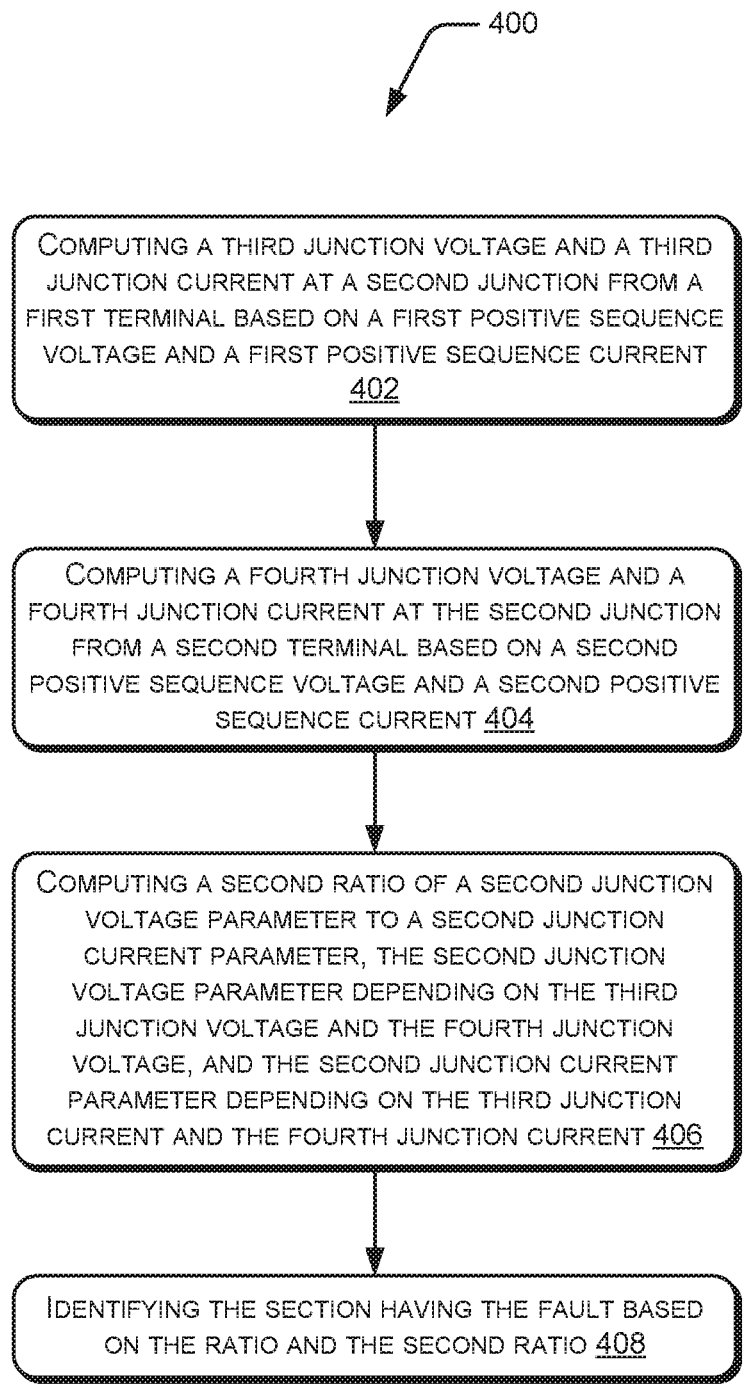
FIG. 4 illustrates a method for identification of a section having fault when a power transmission line includes three sections, in accordance with an implementation of the present subject matter.

FIGS. 3 and 4 illustrate methods 300 and 400, respectively, for identification of a section of a power transmission line having a fault, in accordance with implementations of the present subject matter. The power transmission line includes a first terminal and a second terminal, a first section and a second section between the first terminal and the second terminal, and a junction between first section and the second section. The first section may be an overhead line (OHL) section and the second section may be an underground cable (UGC) section. The power transmission line may be, for example, the power transmission line 102, having the first terminal 104, second terminal 110, first section 116, second section 118, and junction 120. Further, the methods 300 and 400 may be performed by components of the device 100.

The orders in which the methods 300 and 400 are described are not intended to be construed as a limitation, and any number of the described method blocks may be combined in any order to implement the methods 300 and 400, or an alternative method. Furthermore, the methods 300 and 400 may be implemented by processor(s) or computing device(s) through any suitable hardware, non-transitory machine-readable instructions, or a combination thereof.

It may be understood that steps of the methods 300 and 400 may be performed by programmed computing devices and may be executed based on instructions stored in a non-transitory computer readable medium. Although the methods 300 and 400 may be implemented in a variety of systems, the methods 300 and 400 are described in relation to the device 100, for ease of explanation.

Referring to method 300, at step 302, a first positive sequence voltage and a first positive sequence current at the first terminal are computed based on a first voltage and a first current, respectively, at the first terminal. For instance, the first positive sequence voltage is computed based on the first voltage and the first positive sequence current is computed based on the first current. The first positive sequence voltage and the first positive sequence current may be $V_1$ and $I_1$ as explained earlier.

At step 304, a second positive sequence voltage and a second positive sequence current at the second terminal are obtained. The second positive sequence voltage depends on a second voltage at the second terminal and the second positive sequence current depends on a second current at the second terminal. The second positive sequence voltage and the second positive sequence current may be $V_2$ and $I_2$ as explained earlier. The obtaining of the second positive sequence voltage and second positive sequence current may include receiving the second positive sequence voltage and second positive sequence current from a second device, such as the second device 138, or computing the second positive sequence voltage and second positive sequence current by the device 100. To compute the second positive sequence voltage and second positive sequence current, the device 100 may utilize the phasor computation module 126.

At step 306, a first junction voltage and a first junction current at the junction from the first terminal are computed based on the first positive sequence voltage and the first positive sequence current. The first junction voltage and the first junction current may be $V_{J1}$ and $I_{J1}$, respectively, as explained earlier. The computation may be performed using equations (9) and (10). Accordingly, the first junction voltage and the first junction current may be computed based on a length of the first section (l1), propagation constant of the first section (γ1), and characteristic impedance of the first section ($Z_{C1}$).

At step 308, a second junction voltage and a second junction current at the junction from the second terminal is computed based on the second positive sequence voltage and the second positive sequence current. The second junction voltage and the second junction current may be $V_{J2}$ and $I_{J2}$, respectively, as explained earlier. The computation may be performed using equations (11) and (12). Accordingly, the second junction voltage and the second junction current may be computed based on a length of the second section (l2), propagation constant of the second section (γ2), and characteristic impedance of the second section ($Z_{C2}$).

At step 310, a ratio of a junction voltage parameter to a junction current parameter is computed. The junction voltage parameter may depend on the first junction voltage and the second junction voltage, and the junction current parameter may depend on the first junction current and the second junction current. The junction voltage parameter may be a difference between the first junction voltage and the second junction voltage, and the junction current parameter may be a sum of the first junction current and the second junction current. The junction voltage parameter may be JVP1 and may be computed using equation (13) and the junction current parameter may be JCP1 and may be computed using equation (14).

At step 312, the section having the fault is identified based on comparison of the ratio with a threshold. In an example, the ratio is a complex number and the threshold is zero. Accordingly, the section having the fault may be identified based on whether an imaginary part of the ratio is lesser than or greater than zero. For instance, the ratio may be R1, having a real and imaginary part. If the imaginary part of R1 is lesser than zero, the section having the fault may be identified as the first section, and if the imaginary part of R1 is greater than zero, the section having the fault may be identified as the second section, as explained earlier.

The steps 306-312 may be performed by the fault section identification module 128.

In an implementation, based on the section that is identified as having the fault, it may be determined whether an auto-reclosing function is to be enabled or blocked. For instance, as explained earlier, if the fault is identified to be in the first section, which is the OHL section, auto-reclosing may be enabled, and if the fault is identified to be in the second section, auto-reclosing may be blocked. The determination of whether to enable or block, and the consequent enabling or blocking may be performed by the tripping module 130.

In an implementation, in addition to the first section and second section, the power transmission line may include a third section. The third section may be present between the second section and the second terminal. Further, a second junction may be between the second section and the third section. the third section may be the third section 202, and the second junction may be the second junction 204. The identification of the section having the fault in such a case is explained with reference to FIG. 4.

FIG. 4 illustrates a method 400 for identification of a section having fault when the power transmission line includes three sections, in accordance with an implementation of the present subject matter. The steps of the method 400 may be performed by the fault section identification module 128.

At step 402, a third junction voltage and a third junction current at the second junction from the first terminal is computed based on the first positive sequence voltage and the first positive sequence current. The third junction voltage and third junction current may be $V_{J3}$ and $I_{J3}$, respectively, as explained earlier.

At step 404, a fourth junction voltage and a fourth junction current at the second junction from the second terminal is computed based on the second positive sequence voltage and the second positive sequence current. The fourth junction voltage and fourth junction current may be $V_{J4}$ and $I_{J4}$, respectively, as explained earlier.

At step 406, a second ratio of a second junction voltage parameter to a second junction current parameter is computed. The second junction voltage parameter may depend on the third junction voltage and the fourth junction voltage. Further, the second junction current parameter may depend on the third junction current and the fourth junction current. The second junction voltage parameter may be JVP2, the second junction current parameter may be JCP2, and the second ratio may be R2 as explained earlier.

At step 408, the section having the fault is identified based on the ratio and the second ratio.

With the systems and methods of the present subject matter, a section of a power transmission line that has a fault can be accurately determined. Consequently, an informed decision as to whether auto-reclosing is to be performed or not can be taken. The techniques of the present subject matter are not to be implemented using custom-made hardware devices, and can be implemented using already existing hardware devices, such as IEDs. Further, to implement the techniques of the present subject matter, the device performing the techniques may utilize even a low sampling frequency, such as less than 4 KHz, for sampling voltage and current signals.

Although the present subject matter has been described with reference to specific embodiments, this description is not meant to be construed in a limiting sense. Various modifications of the disclosed embodiments, as well as alternate embodiments of the subject matter, will become apparent to persons skilled in the art upon reference to the description of the subject matter. Further, although the present subject matter has been explained with reference to specific configurations of a mixed power transmission line, it is to be understood that the present subject matter can be used for any configuration of mixed power transmission lines.

The invention claimed is:

1. A method for identifying a section of a power transmission line having a fault, the power transmission line having a first terminal, a second terminal, a first section and a second section between the first terminal and the second terminal, and a junction between first section and the second section, the first section being an overhead line section and the second section being an underground cable section, the method comprising:
   computing a first positive sequence voltage at the first terminal based on a first voltage at the first terminal;
   computing a first positive sequence current at the first terminal based on a first current at the first terminal;
   obtaining a second positive sequence voltage at the second terminal, wherein the second positive sequence voltage depends on a second voltage at the second terminal;

obtaining a second positive sequence current at the second terminal, wherein the second positive sequence current depends on a second current at the second terminal;

computing a first junction voltage and a first junction current at the junction from the first terminal based on the first positive sequence voltage and the first positive sequence current;

computing a second junction voltage and a second junction current at the junction from the second terminal based on the second positive sequence voltage and the second positive sequence current;

computing a ratio of a junction voltage parameter to a junction current parameter, the junction voltage parameter depending on the first junction voltage and the second junction voltage, and the junction current parameter depending on the first junction current and the second junction current; and identifying the section of the power transmission line having the fault based on a comparison of the ratio with a threshold.

2. The method of claim 1, wherein the junction voltage parameter is a difference between the first junction voltage and the second junction voltage, and wherein the junction current parameter is a sum of the first junction current and the second junction current.

3. The method of claim 1, wherein the ratio is a complex number having an imaginary part, wherein the threshold is zero, and wherein the comparison of the ratio with the threshold comprises determining whether the imaginary part of the ratio is greater or less than zero.

4. The method of claim 1, wherein:
the power transmission line further comprises (i) a third section between the second section and the second terminal and (ii) a second junction between the second section and the third section;
the method further comprises:
computing a third junction voltage and a third junction current at the second junction from the first terminal based on the first positive sequence voltage and the first positive sequence current;
computing a fourth junction voltage and a fourth junction current at the second junction from the second terminal based on the second positive sequence voltage and the second positive sequence current; and
computing a second ratio of a second junction voltage parameter to a second junction current parameter, the second junction voltage parameter depending on the third junction voltage and the fourth junction voltage, and the second junction current parameter depending on the third junction current and the fourth junction current; and
wherein identifying the section of the power transmission line having the fault comprises identifying the section of the power transmission line having the fault based on both the ratio and the second ratio.

5. The method of claim 1, wherein:
computing the first junction voltage and the first junction current at the junction from the first terminal comprises computing the first junction voltage and the first junction current based on the first positive sequence voltage, the first positive sequence current, a length of the first section, a propagation constant of the first section, and a characteristic impedance of the first section; and
computing the second junction voltage and the second junction current at the junction from the second terminal comprises computing the second junction voltage and the second junction current based on the second positive sequence voltage, the second positive sequence current, a length of the second section, a propagation constant of the second section, and a characteristic impedance of the second section.

6. The method of claim 1, further comprising determining whether auto-reclosing is to be enabled or blocked based on the identification of the section of the power transmission line having the fault.

7. A device for identifying a section of a power transmission line having a fault, the power transmission line having a first terminal, a second terminal, a plurality of sections between the first terminal and the second terminal, and a junction between two sections of the plurality of sections, the device comprising circuitry configured to:
obtain measurements of a first voltage at the first terminal;
obtain measurements of a first current at the first terminal;
obtain measurements of a second voltage at the second terminal;
obtain measurements of a second current at the second terminal;
compute a first positive sequence voltage phasor at the first terminal based on the first voltage;
compute a first positive sequence current phasor at the first terminal based on the first current;
compute a second positive sequence voltage phasor at the second terminal based on the second voltage;
compute a second positive sequence current phasor at the second terminal based on the second current;
compute a first junction voltage and a first junction current at the junction from the first terminal based on the first positive sequence voltage phasor and the first positive sequence current phasor;
compute a second junction voltage and a second junction current at the junction from the second terminal based on the second positive sequence voltage phasor and the second positive sequence current phasor;
compute a ratio of a junction voltage parameter to a junction current parameter, the junction voltage parameter depending on the first junction voltage and the second junction voltage, and the junction current parameter depending on the first junction current and the second junction current; and
identify the section of the power transmission line having the fault based on the ratio.

8. The device of claim 7, further comprising circuitry configured to:
determine whether auto-reclosing is to be enabled or blocked based on the identification of the section of the power transmission line having the fault; and
generate an auto-reclosing command to be sent to a circuit breaker on the power transmission line if auto-reclosing is determined to be enabled.

9. The device of claim 7, wherein the device is an intelligent electronic device (IED) connected to the first terminal and configured to obtain the measurements of the second voltage and the second current from a second IED connected to the second terminal.

10. The device of claim 7, wherein:
the plurality of sections comprises a first section, a second section, and a third section;
the first section is an overhead line section;
the second section is an underground cable section;
the junction is between the first section and the second section,
the third section is between the first terminal and the first section;

a second junction is between the third section and the first section;

the circuitry of the device is further configured to compute a second ratio based on (i) a third junction voltage at the second junction from the first terminal, (ii) a third junction current at the second junction from the first terminal, (iii) a fourth junction voltage at the second junction from the second terminal, and (iv) a fourth junction current at the second junction from the second terminal; and the circuitry of the device is further configured to identify the section of the power transmission line having the fault based on both the ratio and the second ratio.

11. The device of claim 7, wherein:

the plurality of sections comprises a first section, a second section, and a third section;

the first section is an overhead line section;

the second section is an underground cable section;

the junction is between the first section and the second section, the third section is between the second section and the second terminal;

a second junction is between the second section and the third section;

the circuitry of the device is further configured to compute a second ratio based on (i) a third junction voltage at the second junction from the first terminal, (ii) a third junction current at the second junction from the first terminal, (iii) a fourth junction voltage at the second junction from the second terminal, and (iv) a fourth junction current at the second junction from the second terminal; and the circuitry of the device is further configured to identify the section of the power transmission line having the fault based on both the ratio and the second ratio.

* * * * *